United States Patent [19]
Takada et al.

[11] Patent Number: 5,525,379
[45] Date of Patent: Jun. 11, 1996

[54] METHOD FOR MANUFACTURING AN OPTICAL RECORDING MEDIUM

[75] Inventors: Kunio Takada; Kazuoki Hongu, both of Yokohama; Akio Koganei, Ichikawa; Toshimori Miyakoshi, Kawasaki; Toshio Adachi, Inagi, all of Japan

[73] Assignee: Canon Kabushiki Kaisha, Tokyo, Japan

[21] Appl. No.: 513,254

[22] Filed: Aug. 10, 1995

Related U.S. Application Data

[63] Continuation of Ser. No. 221,907, Apr. 1, 1994, abandoned.

[30] Foreign Application Priority Data

Apr. 5, 1993 [JP] Japan ................................. 5-078188

[51] Int. Cl.$^6$ ............................. B05D 3/06; G11B 7/26
[52] U.S. Cl. .................... 427/571; 427/578; 427/579; 427/569; 427/131
[58] Field of Search ................................... 427/571, 578, 427/579, 569, 131

[56] References Cited

U.S. PATENT DOCUMENTS

| | | | |
|---|---|---|---|
| 4,810,935 | 3/1989 | Boswell et al. | 315/111.41 |
| 4,990,229 | 2/1991 | Campbell et al. | 204/298.06 |
| 5,280,154 | 1/1994 | Cuomo et al. | 219/121.52 |

FOREIGN PATENT DOCUMENTS

| | | |
|---|---|---|
| 0489407A3 | 6/1992 | European Pat. Off. . |
| 2344581A | 4/1975 | Germany . |
| 2-15929 | 4/1990 | Japan . |
| 3-66043 | 3/1991 | Japan . |
| 3-69033 | 3/1991 | Japan . |
| 4-30343 | 3/1992 | Japan . |
| 4-90155 | 3/1992 | Japan . |

OTHER PUBLICATIONS

Patent Abstracts of Japan, vol. 12, No. 82 (C–481), Mar. 15, 1988 and JP–A–62 216 638.

Y. Sugiyama, et al., "Phase–Change Optical Disks with High Writing Sensitivity Using a SiN:H Protective Films Prepared by Electron Cyclotron Resonance Plasma Chemical Vapor Deposition," Jap. J. of Appl. Phys., vol. 30, No. 8, Aug. 1991, pp. 1731–1737.

Primary Examiner—Roy V. King
Attorney, Agent, or Firm—Fitzpatrick, Cella, Harper & Scinto

[57] ABSTRACT

The present invention relates to a process for manufacturing an optical recording medium comprising a substrate and a laminate of a recording film and an inorganic dielectric film thereon, and the optical recording medium. The process comprises forming the inorganic dielectric film by using a helicon wave plasma CVD method.

24 Claims, 9 Drawing Sheets

METHOD FOR MANUFACTURING AN OPTICAL RECORDING MEDIUM

This application is a continuation of application Ser. No. 08/221,907 filed Apr. 1, 1994, which is now abandoned.

BACKGROUND OF THE INVENTION

1. Field of the Invention

The present invention relates to an optical recording medium and a process for preparing the same. More specifically, it relates to an optical recording medium comprising a substrate and an inorganic dielectric film thereon, and a process for preparing this kind of optical recording medium.

2. Related Background Art

In recent years, recording media which have a large recording capacity and which are capable of transferring data at a high speed have been demanded as memories for computers and memories for image information. In order to meet this demand, as the recording media, for example, magnetooptical recording media and phase change type recording media have been vigorously developed as optical recording media in which recording and reproduction are made by the use of laser beams.

That is, in the magnetooptical recording media, the recording and reproduction of information are made by the utilization of characteristics (a magnetic force effect) that when a deflected laser beam strikes the surface of a recording layer containing a magnetic material, the rotational direction of the deflected surface of the reflected laser beam depends upon the direction of the magnetization of the magnetic material.

On the other hand, in the phase change type recording medium, the recording and reproduction of information are made by using a reversible phase transition between an amorphous state and a crystalline state generated at the time of irradiating a recording layer containing, e.g., Te with a laser beam, and by using mutually different optical characteristics of the recording layer in these states.

In order for each of these optical recording medium to obtain a read signal having a larger C/N ratio, for example, an inorganic dielectric film can be interposed between a recording film and a substrate to amplify the read signal by the use of an optical interference effect (an enhancement effect). In addition, as shown in FIG. 4A, a recording film 41 can be sandwiched between inorganic dielectric films 42 and 43 to amplify the read beam and to protect the recording film 41.

Moreover, to further heighten the interference effect, as shown in FIG. 4B, using a reflective layer 44 mounted on the inorganic dielectric film 43 is also known.

As such an inorganic dielectric film, there has been used, for example, a thin film of $Si_3N_4$, SiC, SiO, $SiO_2$, amorphous Si (a-Si), AlN, $Al_2O_3$, $TiO_2$, $Ta_2O_5$ or ZnS.

In this connection, performances of the magnetooptical recording medium or the phase change type optical recording medium using the inorganic dielectric film, for example, the C/N ratio of the read signal and the stability with time of the recording film depend largely upon not only the characteristics of the recording film but also those of the dielectric film, as described above. Therefore, in domestic and foreign research facilities, active research has now been carried out to develop dielectric materials having the large enhancement effect of the read signal and having excellent recording layer protection. Manufacturing techniques for these dielectric materials have also been studied. For example, as described in Japanese Patent Publication No. 2-15929, AlN or SiN is prepared in a nitrogen gas atmosphere by reactive sputtering with an Al target or an Si target, and in Japanese Patent Application Laid-open Nos. 3-66043, 3-69033 and 4-30343, it has been attempted to form the inorganic dielectric film for the optical recording medium by means of an ECR plasma CVD method.

In particular, the plasma CVD method improves film formation rate as compared with the sputtering process, and hence much attention has been paid to this plasma CVD method as a technique for obtaining high-quality optical recording media at a low cost.

However, if it is intended to achieve a high level of recording layer protection by using this plasma CVD film formation method, the inorganic dielectric film is inevitably stressed, and this tendency is more noticeable than when the film has been formed, heightening a plasma density to increase the film formation rate. In consequence, the inorganic dielectric film causes the optical recording medium to warp. Accordingly it is impossible to apply such an inorganic dielectric film to the optical recording medium. For this reason, when the inorganic dielectric film for the optical recording medium is formed by means of the plasma CVD method, the recording layer protection of the dielectric film has been heretofore decided in consideration of the internal stress of the inorganic dielectric film.

However, under circumstances where optical recording media having a higher quality is required, it is necessary that the recording layer protection is increased, while the increased internal stress in the inorganic dielectric film is inhibited as much as possible, even in the case where the inorganic dielectric film for the optical recording medium is formed by the plasma CVD method.

SUMMARY OF THE INVENTION

The present invention has been attained to solve the above-mentioned problems, and an object of the present invention is to provide a process for manufacturing an optical recording medium which can stably maintain the C/N ratio of a read signal at a high level for a long period of time, while inhibiting deformation such as warpage or deflection and which has further improved stability with time.

Another object of the present invention is to provide an optical recording medium which inhibits deformation such as warpage or deflection and which has the high C/N ratio of a read signal and which contains a recording layer having excellent stability with time.

We, the present inventors, have intensively investigated with the intention of achieving the above-mentioned objects, and as a result, we have found that when there is applied, to an optical recording medium, an inorganic dielectric film formed by a helicon wave plasma CVD method using plasma which is generated by the inductive coupling of a high-frequency electric field and a magnetic field and which helically propagates along the magnetic field, this optical recording medium is more excellent in shape stability. Further the C/N ratio of a read signal of the optical recording medium can be maintained more stably at a high level, as compared with an optical recording medium using an inorganic dielectric film formed by a conventional method, for example, an ECR plasma CVD method. The present invention has been completed on the basis of this knowledge.

A process for manufacturing an optical recording medium of the present invention is a process for manufacturing an optical recording medium comprising a substrate and a laminate of a recording film and an inorganic dielectric film thereon which is characterized by forming the inorganic dielectric film by using a helicon wave plasma CVD method.

Furthermore, an optical recording medium of the present invention is an optical recording medium comprising a substrate and a laminate of a recording film and an inorganic dielectric film thereon which is characterized in that the inorganic dielectric film is formed by using a helicon wave plasma CVD method.

BRIEF DESCRIPTION OF THE DEDRAWINGS

DETAILED DESCRIPTION OF THE PREFERRED EMBODIMENTS

Next, the present invention will be described in detail in reference to drawings.

Figure 1:
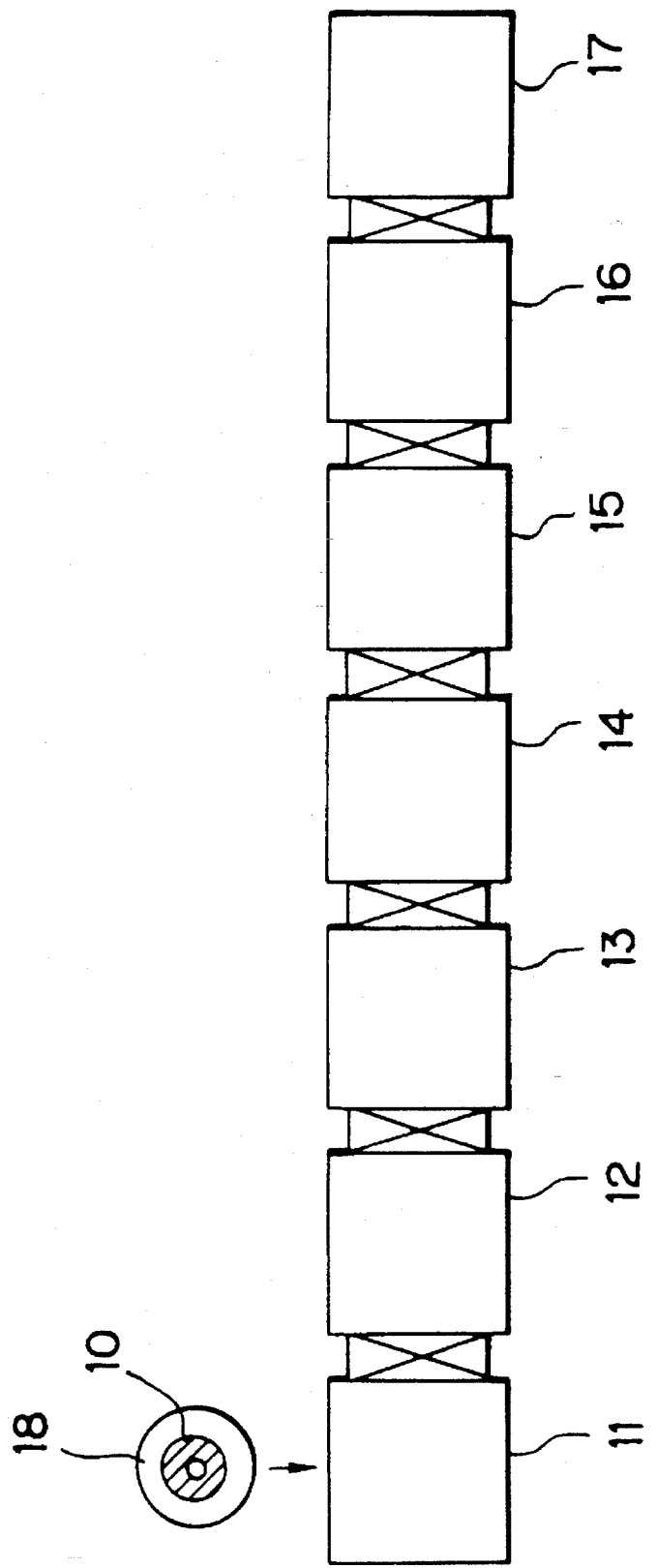
FIG. 1 is a schematic plan view of one embodiment of an apparatus for manufacturing an optical recording medium regarding the present invention.
Figure 4A:
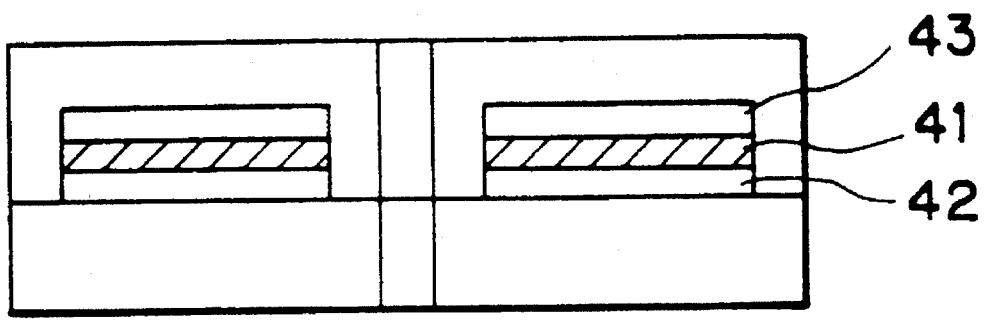
FIGS. 4A and 4B are schematic sectional views of the optical recording medium.
Figure 4B:
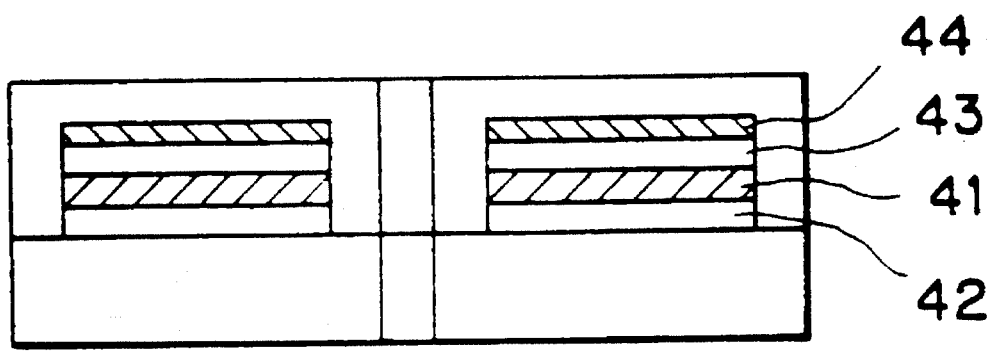

FIG. 1 is a schematic plan view of an apparatus for continuously forming an in-line type inorganic dielectric film and a recording film which can be applied to one embodiment of a process for manufacturing an optical recording medium shown in FIG. 4B regarding the present invention. In FIG. 1, reference numeral 11 is a chamber into which substrates 10 are thrown; numeral 12 is a degassing chamber; 13 and 14 are film formation chambers for inorganic dielectric films 42, 43; 15 is a film formation chamber for a recording film 41, for example, an optical magnetic recording film; 16 is a film formation chamber for a reflective film 44; and 17 is a chamber from which the substrates 10 having the recording film 41 and the inorganic dielectric films 42, 43 formed thereon are taken out. An openable door (not shown) is provided between each pair of the chambers, and a substrate holder 18 for supporting the substrates 10 is provided so as to successively move from the substrate throw chamber 11 to the substrate takeout chamber 17. The substrate 10 for the optical recording medium is conveyed from the substrate throw chamber 11 to the substrate takeout chamber 17, and during this conveyance, gassing the substrate 10, forming the inorganic dielectric film 42, forming the recording film 41, forming the inorganic dielectric film 43 and forming the reflective film 44 are successively carried out to form the optical recording medium in which the laminate of the recording film 41, the inorganic dielectric films 42, 43 and the reflective film 44 is formed on the substrate.

In this embodiment, the film formation chambers 13, 15 for the inorganic dielectric films are provided with helicon wave plasma CVD film formation devices.

Figure 2:
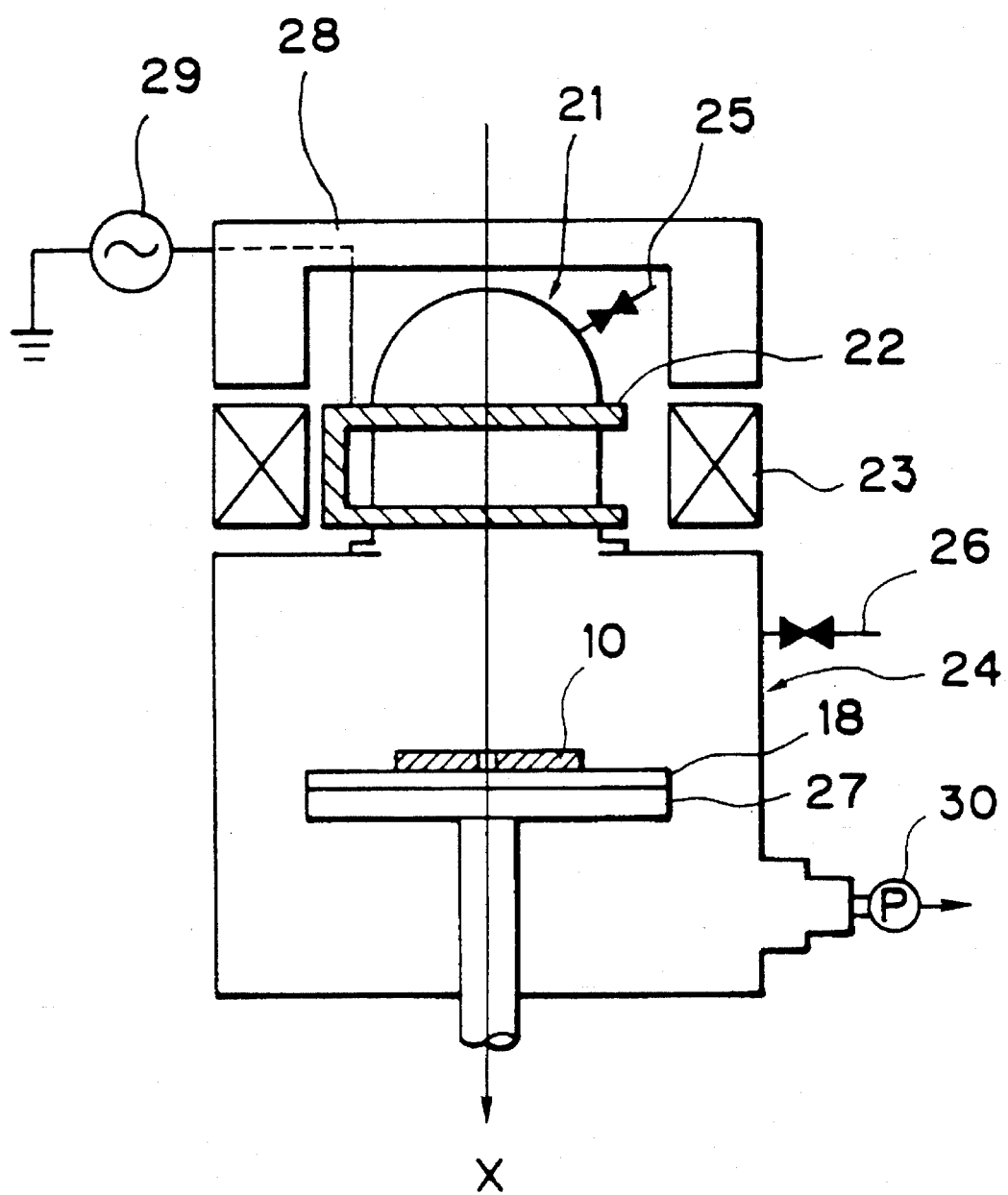
FIG. 2 is a schematic sectional view of one embodiment of an apparatus for forming an inorganic dielectric film in the apparatus shown in FIG. 1.

FIG. 2 is a schematic sectional view in a direction across at right angles to a substrate conveyance direction of one of the helicon wave plasma CVD film formation devices arranged in the film formation chambers 13, 15 for forming an inorganic dielectric film 42, 43 in the film formation apparatus shown in FIG. 1. In FIG. 2, reference numeral 21 is a cylindrical plasma generating container extending about and along a central axis X; numeral 22 is an antenna for forming a high-frequency electric field in the plasma generating container; 23 is a coil for forming a magnetic field in the direction of the axis X in the plasma generating container; 24 is a process container connected to the plasma generating container in the direction of the axis X; 25 is a means for introducing a gas into the plasma generating container 21; 26 is a means for introducing a gas into the process container 24; 27 is a substrate supporting means, which is constituted so as to support the substrate holder 18 for supporting the substrate 10 for an optical disc in the process container so that the film formation surface of the substrate 10 may cross at right angles to the axis X and so as to permit the rotation of the substrate holder about the axis X in a film formation process.

Furthermore, the antenna 22 is connected to an RF power source 29 via a matching box 28, whereby the high-frequency electric field can be formed in the plasma generating container 21.

Figure 3:
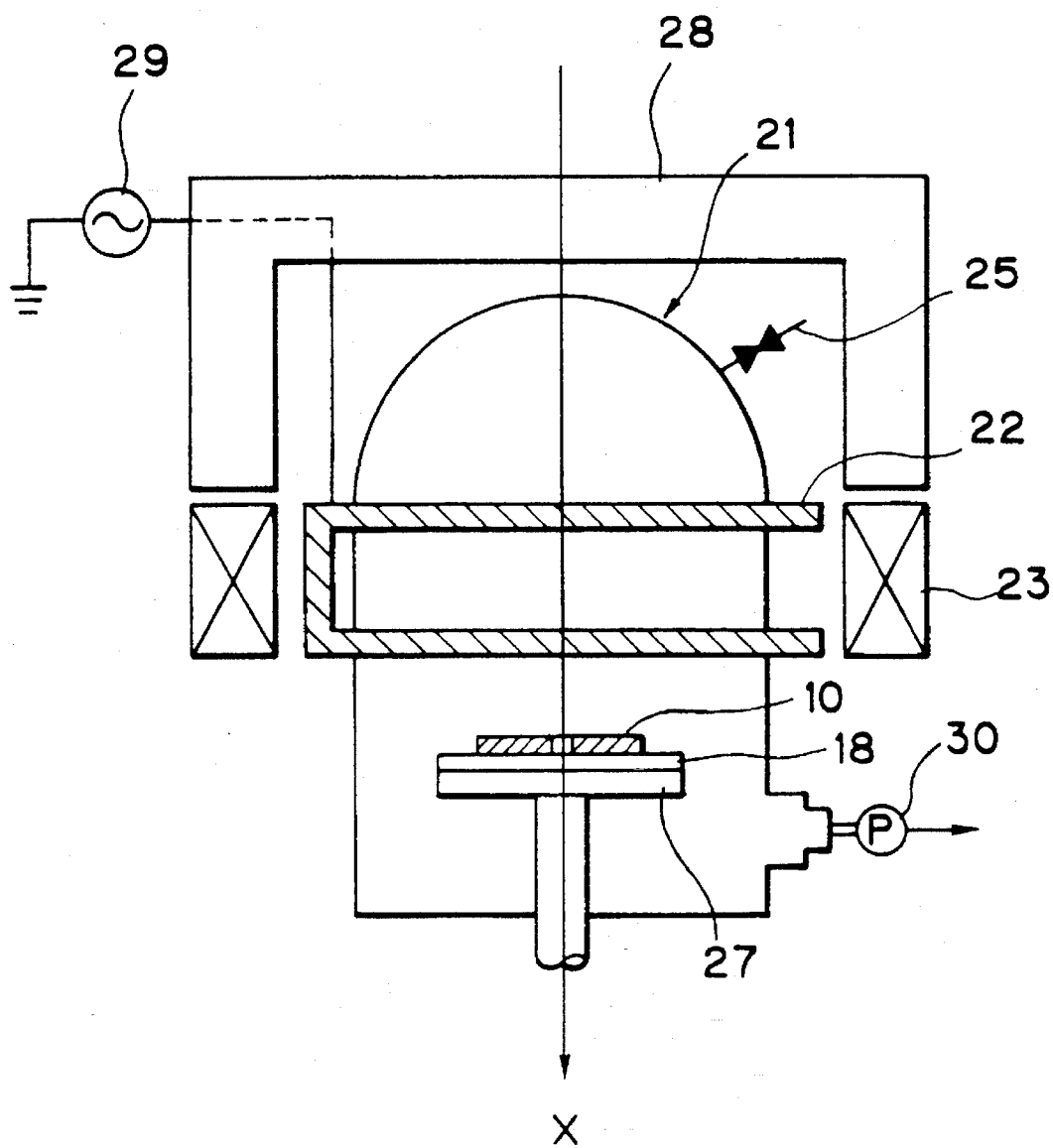
FIG. 3 is a schematic sectional view of another embodiment of the apparatus for forming an inorganic dielectric film in the apparatus shown in FIG. 1.

FIG. 3 is a schematic sectional view of another embodiment of the helicon wave plasma CVD film formation device which can be used in the inorganic dielectric film formation chambers 13 and 15 in the in-line type film formation apparatus in FIG. 1. The embodiment in FIG. 3 is the same as the helicon wave plasma CVD device in FIG. 2 except that the process container 24 is integrated into the plasma generating container 21 and thus one gas introducing means 25 is used.

In the case that, for example, an $SiN_x$ film is formed by using the helicon wave CVD film formation device constituted as shown in FIG. 2, the plasma generating container 21 and the process container 24 are evacuated by means of a vacuum pump 30. Afterward, a nitrogen gas is introduced as a reaction gas into the plasma generating container 21 through the introduction pipe 25, and $SiH_4$ is further introduced as a reactive gas into the process container 24. Next, the antenna 22 is used to generate a high-frequency electric field in the plasma generating container, and simultaneously the coil 23 is used to form a magnetic field in the direction of the axis X in the plasma generating container, whereby the plasma of the nitrogen gas origin can be mainly generated in the plasma generating container 21 and the plasma can be helically propagated along the magnetic field and led to the process container. In this process container, the SiH$_4$ gas absorbs the energy of the plasma to be ionized, so that the SiN$_x$ film is formed on the substrate.

The coil 23 which can be used in the helicon wave CVD film formation device shown in FIG. 2 or 3 is preferably arranged so that the magnetic field may be generated in the direction of the axis X in the plasma generating container 21, because the above-mentioned arrangement of the coil permits the generation of the helicon wave plasma in the plasma generating container 21. The strength (G) of the magnetic field to be applied is preferably set so that the density of the plasma produced in the plasma generating container 21 in cooperation with the RF electric field applied to the container 21 may be at least $1\times10^{11}$ elementary particles/cm$^3$, preferably $1\times10^{12}$ elementary particles/cm$^3$ or more. Particularly, in the case that the RF electric field having a frequency of about 10 to 30 MHz is formed in the plasma generating container 21 by the antenna 22, the number of turns of the coil and/or a current which flows through the coil is preferably adjusted so that "G" in the central portion of the plasma generating container 21 may be in the range of 0 to 500 gausses, preferably 0 to 200 gausses, more preferably 0 to 100 gausses, because the above-mentioned adjustment permits the prevention of stress increase and the formation of the inorganic dielectric film for the optical recording medium having a high recording layer protection performance.

Figure 5A:
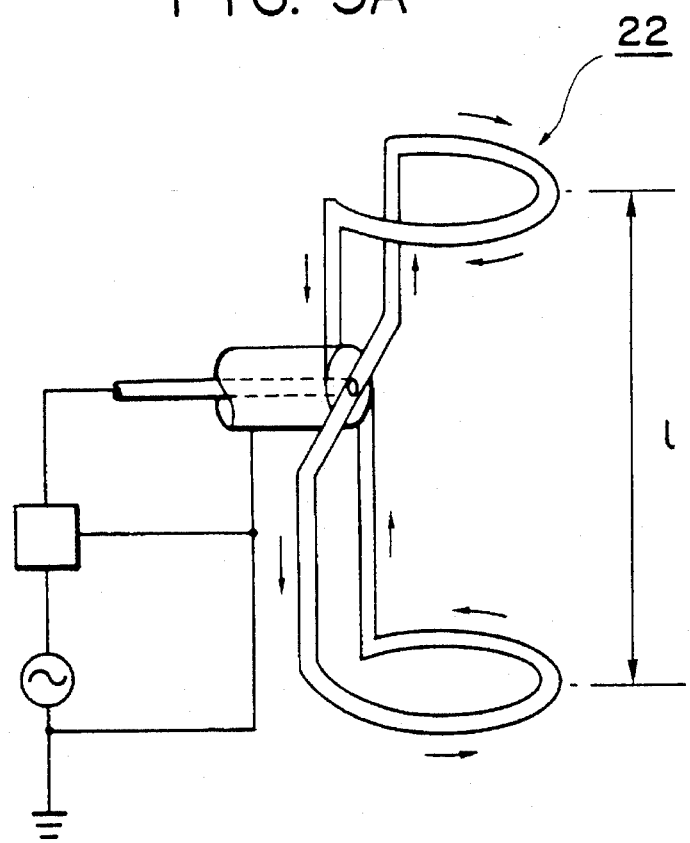
FIG. 5A is a schematic view of one embodiment of an antenna for use in the apparatus for film formation shown in FIG. 2 or 3.
Figure 5B:
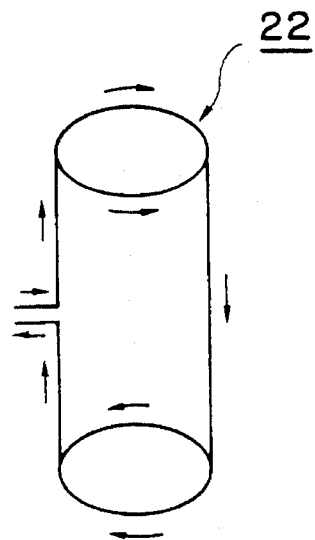
FIG. 5B is a schematic view of another embodiment of the antenna for use in the apparatus for film formation shown in FIG. 2 or 3.
Figure 5C:
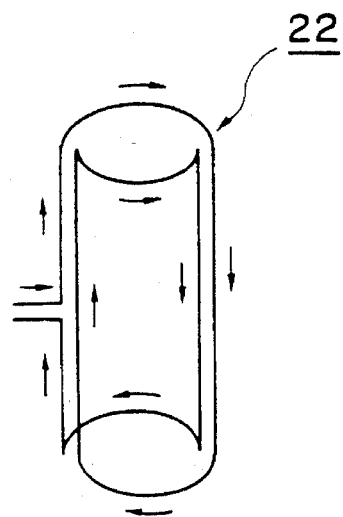
FIG. 5C is still another schematic view of one embodiment of the antenna for use in the apparatus for film formation shown in FIG. 2 or 3.

Furthermore, in this embodiment, the antenna 22 which is the means for generating the RF electric field in the plasma generating container preferably has a structure shown in FIG. 5A, 5B or 5C so that an RF current may draw two mutually separated circulating loops so as to surround the plasma generating container 21 and so that the RF current may flow clockwise through one loop and counterclockwise through the other loop, as disclosed in, for example, U.S. Pat. No. 4,990,229, whereby the stress of the inorganic dielectric film can be lowered.

In particular, the employment of the antenna having the structure shown in FIG. 5A makes it possible to form the high-quality inorganic dielectric film at a high speed, and so this antenna is preferable to manufacture the high-quality optical recording medium at a low cost. The reason why the antenna having such a structure exerts the above-mentioned effect is not apparent, but it can be presumed that the effect is attributable to a fact that an influence due to an interaction between the magnetic field generated at a time when the RF current flows through the antenna and the magnetic field applied by the coil 23 can be decreased to a relatively low level.

In addition, a space (l) between the two loops surrounding the plasma generating container 21 is preferably controlled to improve the quality of the inorganic dielectric film and to correspondingly improve that of the optical recording medium. This space (l) depends upon the material of the film, the frequency of the electric field to be applied, the size of the plasma generating container 21 and the strength of the magnetic field applied by the coil 23, and so it cannot be decided generically. However, for example, in the case that the Si-based inorganic dielectric film is formed under conditions that the inner diameter of the plasma generating container 21 is 80 to 300 mm, the frequency of the RF electric field is 10 to 30 MHz, the magnetic field strength at the central portion in the plasma generating container 21 is in the range of $0<G\leq500$ gausses, the space (l) between the loops is preferably 100 to 500 mm, more preferably 100 to 250 mm, so that an enhancement effect comparable to that of a film formed by sputtering can be obtained, whereby there can be prepared the inorganic dielectric film which can provide the high-quality optical recording medium having a refractive index of about 1.7 to 3.7, preferably about 1.9 to 2.7, a stress of $\pm+$kg/mm$^2$ or less, preferably $\pm25$ kg/mm$^2$ or less (wherein "+" and "−" mean tensile stress and compression stress, respectively) and the extremely excellent recording protection performance. The above-mentioned value of the stress is required for the inorganic dielectric film to suppress the deformation of the optical recording medium.

Figure 7A:
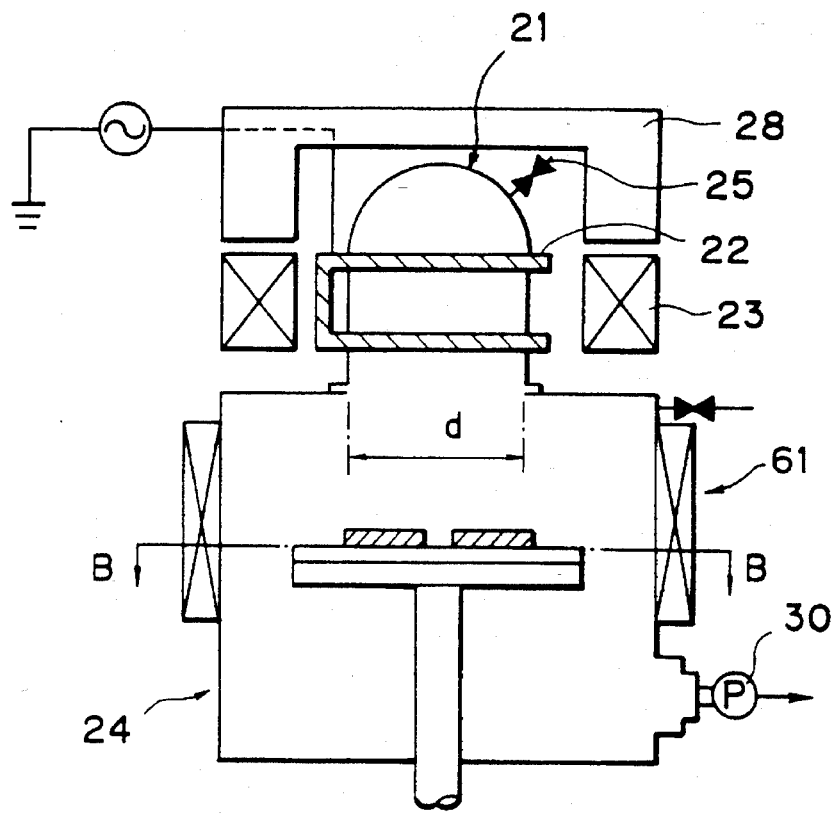
FIG. 7A is a schematic illustrative view of a substrate installation region on a substrate holder.
Figure 7B:
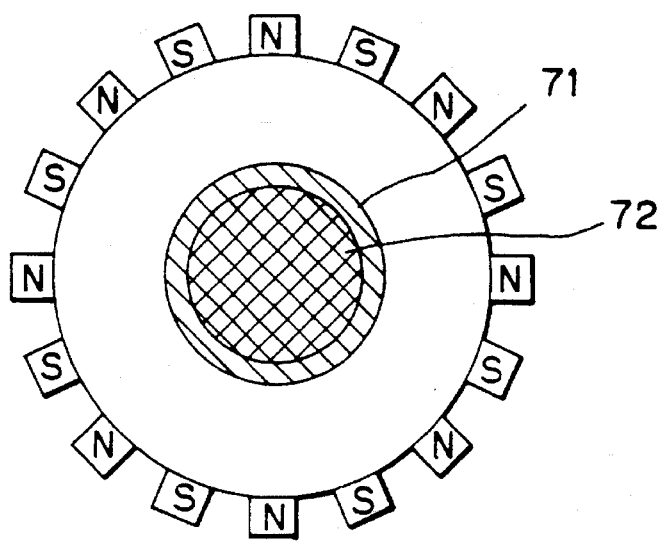
FIG. 7B is a schematic plan view of the substrate installation region on the substrate holder.

Next, reference will be made to the position of the substrate mounted in the process container or the plasma generating container in the present invention. For example, in the case that the helicon wave CVD film formation device shown in FIG. 2 is used, as shown in FIG. 7A and FIG. 7B which is its sectional view taken along a line B—B, the substrate is preferably mounted so as to be present in a region 71 of a circle having a radius of d/0.5, preferably d/1.6 about the axis X wherein d is the diameter of a window at a connected portion of the plasma generating container 21 and the process container 24.

According to this constitution, the inorganic dielectric film on one substrate can be inhibited from having uneven thickness, and when the films are simultaneously formed on a plurality of the substrates, the optical recording medium can be inhibited from having uneven quality due to the uneven thickness of the inorganic dielectric films having the same lot.

Now, reference will be made to a gas which can be used to form the inorganic dielectric films for the optical recording medium by the helicon wave plasma CVD process of the present invention. In the case of forming Si-based semiconductor films such as a-Si and SiC by way of the inorganic dielectric films, examples of the raw material gas containing Si include inorganic silanes such as SiH$_4$ and SiH$_6$; organic silanes such as tetraethylsilane (TES), tetramethylsilane (TMS) and dimethylsilane (DMS); halosilanes such as SiF$_4$, Si$_2$F$_6$, SiHF$_3$, SiH$_2$F$_2$, SiCl$_4$, Si$_2$Cl$_6$, SiHCl$_3$, SiH$_2$Cl$_2$, SiH$_3$Cl and SiCl$_2$F$_2$ which are in a gaseous state at ordinary temperature or can be easily gasified. They can be used singly or in combination.

In the case of forming an Si compound film of SiN$_x$, SiO, SiO$_2$ or the like as the inorganic dielectric film, a raw material gas containing an Si atom and a reactive gas are suitably used. Examples of the raw material gas include inorganic silanes such as SiH$_4$ and SiH$_6$; organic silanes such as tetraethoxysilane (TEOS), tetramethoxysilane (TMOS) and octamethylcyclotetrasilane (OMCTS); halosilanes such as SiF$_4$, Si$_2$F$_6$, SiHF$_3$, SiH$_2$F$_2$, SiCl$_4$, Si$_2$Cl$_6$, SiHCl$_3$, SiH$_2$Cl$_2$, SiH$_3$Cl and SiCl$_2$F$_2$ which are in a gaseous state at ordinary temperature or can be easily gasified. Examples of the reactive gas include NH$_3$, N$_2$H$_4$, hexamethyldisilazane (HMDS), O$_2$, O$_3$, H$_2$O, NO, N$_2$O and NO$_2$.

In the case of forming a metallic compound thin film of AlN, Al$_2$O$_3$, TiO$_2$, Ta$_2$O$_5$ or the like as the inorganic dielectric film, a raw material gas containing a metallic atom and a reactive gas are suitably used. Examples of the raw material gas include organic metals such as trimethylaluminum (TMAl), triethylaluminum (TEAl), triisobutylaluminum (TIBAl) and a dimethylaluminum halide (DMAlH); halogen metals such as AlCl$_3$, TiCl$_3$ and TaCl$_5$. Examples of the reactive gas include O$_2$, O$_3$, H$_2$O, NO, N$_2$O, NO$_2$, N$_2$, NH$_3$, N$_2$H$_4$ and hexamethyldisilazane (HMDS).

In the case that the two kinds of gases, i.e., the raw material gas and the reactive gas are used for the formation of the inorganic dielectric film as described above, it is preferable that the two-chamber structure apparatus having the plasma generating container 21 and the process container 24 is used as shown in FIG. 2 and the reactive gas and the raw material gas are introduced into the different containers. In particular, when the reaction gas is introduced into the plasma generating container through the gas introduction means 25 and the raw material gas is introduced into the process container 24 through the gas introduction means 26, the density of the plasma in the vicinity of the substrate 10 can be increased, so that the inorganic dielectric film which can provide the high-quality optical recording medium can be manufactured very effectively.

Figure 6A:
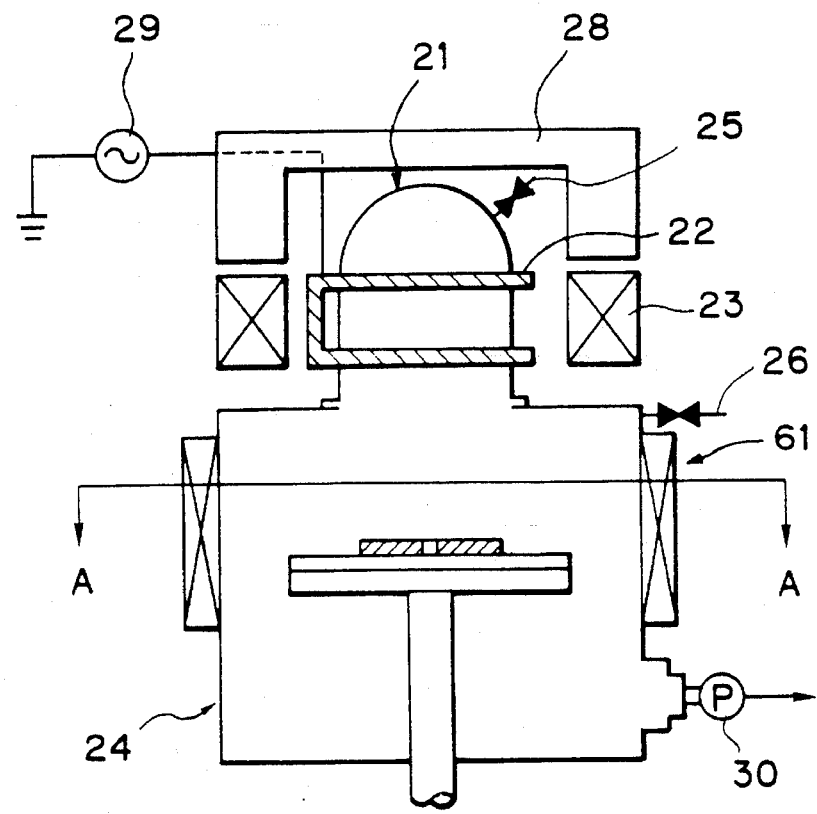
FIG. 6A is a schematic sectional view of another embodiment of the apparatus for forming the inorganic dielectric film in the apparatus shown in FIG. 1.
Figure 6B:
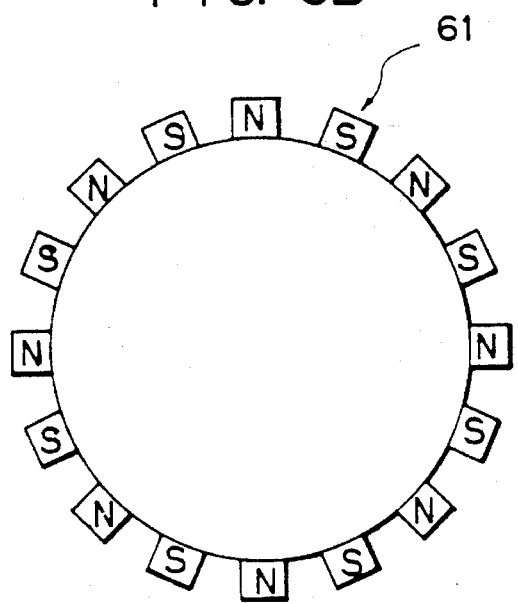
FIG. 6B is a sectional view taken along the line A—A in FIG. 6A.

As shown in FIGS. 6A and 6B, permanent magnets 61 can be arranged on the outer periphery of the process container 24 so that the N pole and the S pole of the permanent magnets may be alternated and so that the permanent magnets having the same pole may extend in the direction of the axis X. In this case, while the excellent recording layer protection performance and the low internal stress which are preferable characteristics of the inorganic dielectric film for the optical recording medium are maintained, the inorganic dielectric film is inhibited from depositing on the inside wall of the process container 24, whereby the high efficiency of the film formation process can be preferably attained.

In this connection, the strength of the permanent magnets is preferably in the range of 200 to 1,000 gausses, more preferably 700 to 900 gausses, most preferably about 800 gausses.

Next, reference will be made to conditions for forming the inorganic dielectric film for the optical recording medium by the use of the above-mentioned helicon wave plasma CVD apparatus. The power of an RF current which is fed from the RF power source to the antenna is preferably in the range of 0.5 to 5 kW, more preferably 1 to 3 kW. Furthermore, when the film is formed, the total pressure of the raw material gas, the reaction gas or a mixed gas of these gases in the plasma generating container and/or the process container is preferably in the range of 0.1 to 2 pa, more preferably 0.5 to 1.0 pa.

In the process for manufacturing the optical recording medium of the present invention, there are no particular requirements other than an inorganic dielectric film formation step by the helicon wave plasma CVD method which is the characteristic requirement of the present invention. For example, the order of the inorganic dielectric film formation step and an optical recording film formation step is not limited to the order of the in-line process in FIG. 1. The film formation can be carried out successively in accordance with the constitution of the desired optical recording medium.

In a recording film formation step, a known film formation method suitable for the characteristics of a material for the recording film can be used. For example, vapor deposition, sputtering, wet coating or the like can be used.

In the present invention, any optical recording film can be used without particular restriction, so long as it can record and reproduce information by irradiation with a light beam. For example, there is the recording film containing a chalcogenide element such as Te. Also there are optical magnetic recording film which have an amorphous magnetic film containing rare earth elements and/or transition metals such as Tb—Fe—Co, Gd—Fe—Co, Tb—Fe—Co—Cr or Gd—Fe—Co—Cr or a laminate of such amorphous magnetic films, but they are very corrosive. Hence, the inorganic dielectric film is required to have the particularly excellent recording layer protection performance. Thus, the application of the present invention to these optical magnetic recording films is preferable in that the effect of the process for manufacturing the optical recording medium of the present invention can be more effectively utilized.

In the optical recording medium of the present invention, the thickness of the inorganic dielectric film depends upon the material and constitution of the recording layer and the characteristics of the inorganic dielectric film. For example, as shown in FIGS. 4A and 4B where the two inorganic dielectric films are arranged to sandwich the optical magnetic recording film therebetween, the thickness of the inorganic dielectric film between the substrate and the optical magnetic recording film is preferably in the range of about 100 to 1,500 Å, and that of the inorganic dielectric film on the optical magnetic recording film is preferably in the range of about 100 to 1,000 Å.

If necessary, a protective layer may be formed on the recording layer, the inorganic dielectric film or the reflective layer of the optical recording medium obtained by the process for manufacturing the optical recording medium of the present invention.

In this case, the formation of the protective layer can be achieved, for example, by applying a photo-setting resin onto the recording layer so that the protective layer may have a predetermined thickness (e.g., 10 to 30 μm), followed by light irradiation to cure the resin, or alternatively by sticking a previously formed resin sheet (e.g., a polycarbonate resin sheet or a polyester resin sheet) having the predetermined thickness on the recording layer, the inorganic dielectric film or the reflective layer by the use of a suitable adhesive or the like. In particular, the employment of the previously formed resin sheet having the predetermined thickness as the protective layer is preferable, because the optical recording medium can be prevented from being deformed owing to the internal stress which the protective layer has.

As the substrate for the optical recording medium of the present invention, there can be used a usual substrate for the optical recording medium. Examples of the usable substrate include substrates comprising glasses, bisphenol-based polycarbonate resins, other modified polycarbonate resins, acrylic resins and amorphous polyolefin resins.

As described above, according to the present invention, the following functional effects can be obtained:

The recording layer protection performance of an inorganic dielectric film can be remarkably improved within the range of stress which the inorganic dielectric film for an optical recording medium can involve, so that the optical recording medium having higher quality can be manufactured.

The inorganic dielectric film for the optical recording medium having low internal stress and an excellent recording layer protection performance can be formed, while maintaining the high-speed formation feature of a plasma CVD method. In consequence, the optical recording medium having higher quality can be manufactured at a low cost.

The inorganic dielectric film for the optical recording medium having low internal stress and excellent recording layer protection performance can be formed at a high speed, while the temperature rise of a substrate is inhibited. Thus, the warpage and deformation of the substrate can be suppressed, so that the optical recording medium which is excellent in shape stability can be manufactured.

In contrast to an ECR plasma CVD device, it is possible to form the high-quality inorganic dielectric film for the optical recording medium by the use of a low-frequency RF current and a weak magnetic field, so that the cost of the high-quality optical recording medium can be reduced.

Next, the present invention will be described in more detail in reference to examples.

EXAMPLE 1

The following procedure was used to manufacture a magnetooptical disc in which a 950-Å-thick $SiN_x$ film as a first dielectric film, a laminate of a 100-Å-thick Gd—Fe—Co amorphous magnetic layer and a 200-Å-thick Tb—Fe—Co amorphous magnetic layer as a recording layer, a 300-Å-thick $SiN_x$ film as a second dielectric layer, and a 600-Å-thick Al film as a reflective layer were laminated in this order on a surface of a disc substrate having an outer diameter of 130 mm, an inner diameter of 15 mm and a thickness of 1.2 mm, the substrate being provided with a spiral pregroove having a width of 0.6 μm, a pitch of 1.6 μm and a depth of 800 Å on the surface and made of a polycarbonate resin (trade name Yupiron H4000; made by Mitsubishi Gas Chemical Co., Ltd.).

That is, in the first place, an in-line type film formation apparatus in FIG. 1 was prepared.

In first and second $SiN_x$ film forming chambers 13 and 15 of this film formation apparatus, helicon wave CVD film formation devices were arranged as shown in FIG. 2.

A plasma generating container 21 in each helicon wave CVD film formation device used herein comprises a cylinder having an outer diameter of 115 mm, an inner diameter of 100 mm and a length of 150 mm, and this container 21 is connected to a cylindrical process container 24 arranged vertically under the container 21 and having an outer diameter of 400 mm, an inner diameter of 380 mm and a length of 450 mm so that central axes of both the containers might be coincident with each other. In this case, the diameter (d) of a window at the connected portion was 100 mm. A used antenna 22 had a structure shown in FIG. 5A. In this antenna, the radius of each loop portion was 65 mm, and a space 1 between the loops was 150 mm. A coil 23 for applying a magnetic field to the plasma generating container was constituted so as to generate a magnetic field of 100 gausses in the vicinity of the central axis portion in the plasma generating container 21. A disc substrate 10 was mounted on a substrate supporting means 27 during a film formation step so as to always lie in a circular region having a radius of 62 mm about the central axis of the process container 24.

Next, one substrate holder 18 to which the disc substrate 10 was attached was thrown into a substrate throw chamber 11 of the in-line type film formation apparatus having the SiN film formation chamber constituted as described above, and the substrate was then conveyed to a degassing chamber 12, in which deaeration was carried out. Afterward, the substrate was conveyed to a first $SiN_x$ film forming chamber, in which a first $SiN_x$ film was formed.

As conditions for the $SiN_x$ film formation, the plasma generating container 21 and the process container 24 were evacuated by the use of a vacuum pump 30 up to $10^{-5}$ Pa, and a nitrogen gas was then introduced into the plasma generating container through a gas introduction means 25 at a flow rate of 203 SCCM and a $SiH_4$ gas was also introduced into the process container through a gas introduction means 26 at a flow rate of 306 SCCM. In this case, the pressure in the plasma generating container 21 and the process container 24 was adjusted to 0.7 Pa.

Next, an RF current having a frequency of 13.56 MHz and a power of 2.8 kW was caused to flow through the antenna from an RF power source, and a current of 5 A was also caused to flow through the coil to form a magnetic field of 100 gausses in the plasma generating container, whereby an $SiN_x$ film was formed. As a result, the formation of the first $SiN_x$ film having a thickness of 950 Å was completed in about 8 seconds, and the deposition rate of the $SiN_x$ film was about 7,000 Å/minute. The temperature of the substrate just after the film formation was about 50° C.

After completion of the first $SiN_x$ film formation, the substrate was conveyed to a recording layer forming chamber, in which a Gd—Fe—Co film and a Tb—Fe—Co film were formed by an RF sputtering process.

In this case, as a sputtering target, there was used a Gd—Fe—Co alloy target having a diameter of 150 mm and a thickness of 6 mm or a Tb—Fe—Co alloy target having the same size. As conditions of the RF sputtering, the chamber was evacuated to $1\times10^{-5}$ Pa, and the sputtering was then carried out at an Ar gas pressure of 0.1 Pa and an RF power of 5.6 W/cm².

After the formation of the recording layer, the substrate was conveyed to a second $SiN_x$ film forming chamber 15, in which the $SiN_x$ film was formed under the same conditions as in the case of the formation conditions for the first $SiN_x$ film. Therefore, the formation time of the second $SiN_x$ film was 2 or 3 seconds.

Next, this substrate was conveyed to a reflective film forming chamber, in which an Al reflective film was formed by an RF sputtering process. In this case, as a sputtering target, there was used an Al target having a diameter of 150 mm and a thickness of 6 mm. As conditions of the RF sputtering, the chamber was evacuated to $1\times10^{-5}$ Pa, and the sputtering was then carried out at an Ar gas pressure of 0.2 to 0.4 Pa and an RF power of 5 to 7 W/cm².

Next, the substrate was taken out from the in-line type film forming apparatus, and a rubber-based adhesive prepared by blending 100 parts by weight of a polystyrene-polybutadiene block copolymer (trade name Kaliflex TR1107; made by Shell Petrochemical Co., Ltd.), 50 parts by weight of a modified wood rosin and 1 part by weight of a stabilizer was applied onto the Al reflective film. Afterward, a film having a thickness of 6 μm obtained by curing a urethane acrylate-based ultraviolet-setting resin was laminated on the adhesive layer to prepare an optical magnetic disc.

In accordance with this procedure, 10 magnetooptical discs were prepared in all. For the thus obtained magnetooptical discs, a C/N ratio and a defect occurrence ratio (B.E.R./Bit Error Rate) were measured and evaluated at an early stage and after standing at 80° C. at RH of 85% for 1,500 hours.

In this case, the C/N ratio and B.E.R. were measured by mounting the optical magnetic disc on a magnetooptical disc recording/reproduction inspecting device (trade name LN52A; made by Sibasoku Co., Ltd.), and then recording and reproducing information.

In this case, conditions for the recording and reproduction were as follows:

| | |
|---|---|
| Linear speed: | 9.04 m/sec |
| Recording frequency: | 6 MHz |
| Recording power: | 10 mW |
| Reproduction power: | 1 mW |
| Recording/reproduction light wavelength: | 830 nm |

For the thus prepared magnetooptical discs, a tilt angle was measured by the use of a tilt angle measuring equipment (trade name LM-100; made by Ono Sokki Co., Ltd.). The data of the C/N ratio, B.E.R. and the tilt angle were averages of the measured values of the 10 discs.

The results of the above-mentioned measurement are shown in Table 1. In Table 1, the C/N ratio was evaluated on the basis of the ranking: A=a case where a difference between the ratios before and after the durability test was less than 3 dB, B=a case where it was in the range of 3 to 8 dB, and C=a case where it was more than 8 dB.

B.E.R. was evaluated on the basis of the ranking: A=a case where a value after the durability test was on the same order as an initial value, B=a case where it was less than the initial value by one figure, and C=a case where it was less than the initial value by two figures.

The tilt angle was evaluated on the basis of the ranking: A=a case where a measured angle was 5 mrad or less, and B=a case where it was more than 5 mrad.

For the first $SiN_x$ film prepared by the above-mentioned helicon wave plasma CVD method, stress and a refractive index were measured as follows.

That is, an $SiN_x$ film was formed on a glass substrate for stress measurement having a diameter of 30 mm and a thickness of 1.0 mm under all the same film formation conditions as described above, and the deformation of this substrate was inspected in terms of the number of Newton's rings by the use of an interferometer. Here, if the number of the Newton's rings is represented by m, a curvature radius r of the substrate can be obtained from the equation (1)

$$r = a^2/m\lambda \quad (1)$$

wherein a: a radius of the substrate, and

λ a wavelength of a light source used in the interferometer.

Furthermore, a stress σ of the first $SiN_x$ film can be obtained by introducing the value of r into the formula (2)

$$\sigma = Eb^2/6(1-v)rd \quad (2)$$

wherein E: a Young's modulus of the substrate, v: a Poisson's ratio of the substrate, r: a curvature radius of the substrate, d: a thickness of the $SiN_x$ film, and b: a thickness of the substrate.

The refractive index of the first $SiN_x$ film was calculated from a reflectance of spectral properties of the sample in which the film was formed on the glass substrate. That is, for the one sample, the reflectances were measured at 10 optional points, and the refractive indexes were calculated from these reflectances and an average of these refractive indexes was regarded as the refractive index of this sample. Table 1 shows minimum and maximum values of the data of the stress and the refractive index obtained from the 10 samples prepared under the same conditions.

In order to measure the thickness unevenness of the first $SiN_x$ film formed by the above-mentioned helicon wave plasma CVD method, 10 glass discs having a diameter of 130 mm and a thickness of 1.2 mm were prepared, and an $SiN_x$ film having a thickness of 2,000 Å was then formed on the first film of each disc by all the same helicon wave plasma CVD method as described above. Afterward, the thickness of the $SiN_x$ film was measured at 8 optional points in a region (which corresponds to the recording region of the optical magnetic disc) between a circle having a radius of 30 mm and another circle having a radius of 60 mm on this disc. Evaluation was made on the basis of the ranking: AA=a case where all the values of the film thickness at all the measured points on each disc were ±2.5% or less with respect to a standard thickness, A=a case where they were more than ±2.5% and not more than ±3%, B=a case where they were more than ±3% and not more than ±5%, and C=a case where they were more than ±5%.

Furthermore, disc substrates having a diameter of 130 mm and a thickness of 1.2 mm were newly made from a polycarbonate resin (trade name Yupiron H4000; made by Mitsubishi Gas Chemical Co., Ltd.), and an $SiN_x$ film having a thickness of 950 Å was formed on each substrate by the same procedure of the helicon wave plasma CVD method as described above. During the film formation, temperatures of the substrates were measured by the use of a thermo-couple attached to the back surface of the substrate. The obtained results are shown in Table 1.

Comparative Example 1

Figure 8:
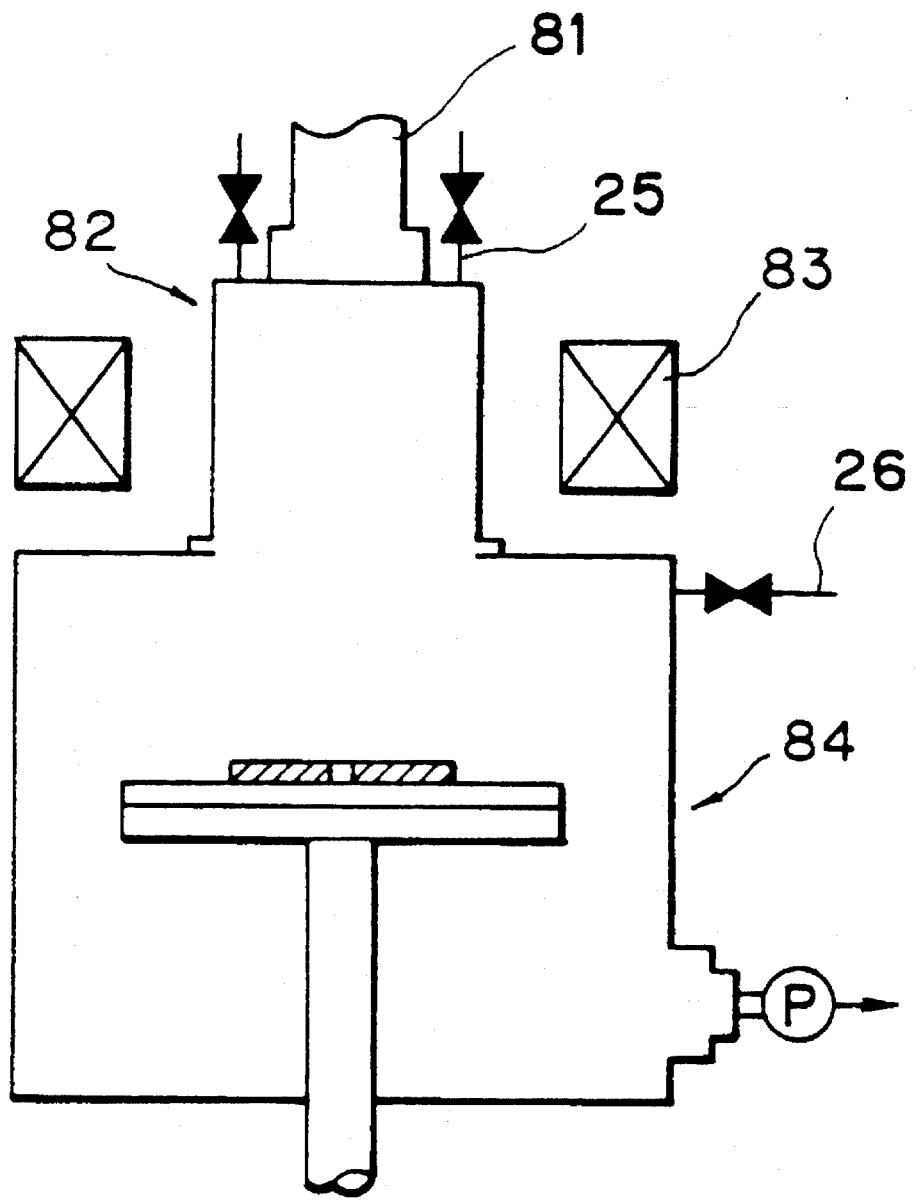
FIG. 8 is a schematic sectional view of an ECR plasma CVD film formation device.

The same procedure as in Example 1 was carried out except that film formation devices 13 and 15 for first and second $SiN_x$ films used in Example 1 were replaced with electron beam cyclotron resonance (ECR) plasma CVD film formation devices shown in FIG. 8, equipped with a means 81 for introducing microwave into a chamber and a coil 83 for generating the electron cyclotron resonance in the chamber, to prepare a magnetooptical disc.

In this comparative example, as conditions for $SiN_x$ film formation, the internal stress of the $SiN_x$ film was set so as to be in a stress range (0 to −30 kg/mm$^2$) which an inorganic dielectric film for the optical magnetic disc could tolerate. In the concrete, the microwave having a frequency of 2.45 GHz was introduced into the plasma generating container 82 via a wave guide 81, and a magnetic field (875 gausses) which could meet conditions for the electron cyclotron resonance was then generated in the container by means of the coil 83 arranged outside the container. In this case, a microwave power of 500 W was used and $SiH_4$ and $N_2$ were fed at gas flow rates of 10 SCCM and 30 SCCM, respectively, and the gas pressure in the plasma generating container 82 and a process container 84 was adjusted to 1.0 Pa. In this connection, the plasma generating container 82, the process container 84 and the substrate were arranged as in Example 1. The internal stress of the thus prepared $SiN_x$ film was −30 kg/mm$^2$ or less.

For the thus prepared magnetooptical disc, evaluation was made in the same manner as in Example 1. As a result, when the disc was stored under high-temperature and high-humidity conditions, the large decline of a C/N ratio and the large rise of B.E.R. were observed, as shown in Table 1.

Comparative Example 2

The same procedure as in Comparative Example 1 was carried out except that a gas pressure which was one of film formation conditions in Comparative Example 1 was set to 0.2 Pa to increase a plasma density with the intention of obtaining a condensed $SiN_x$ film having a high protection performance, thereby preparing a magnetooptical disc. This magnetooptical disc was evaluated in the same manner as in Example 1.

Furthermore, the stress of the $SiN_x$ film formed under the conditions of this comparative example was also measured in the same manner as in Example 1. As a result, as shown in Table 1, the values of the C/N ratio and B.E.R. were high and so they were excellent even after the durability test. However, the internal stress of the $SiN_x$ film was high, and so its tilt angle after the durability test was in excess of 5 mrad which was a standard value.

TABLE 1

|  | Example 1 | Comp. Example 1 | Comp. Example 2 |
|---|---|---|---|
| Evaluation of C/N Ratio (dB) | A | C | A |
| Evaluation of B.E.R. | A | C | A |
| Tilt Angle (mrad) | A | A | B |
| Stress (kg/mm$^2$) | −5.2 to −25.3 | −10.0 to −30.0 | −80.0 to −100.0 |
| Refractive Index | 2.17 to 2.25 | 2.05 to 2.20 | 2.16 to 2.25 |
| Film Formation Rate (nm/min) | 700 | 60 | 50 |
| Distribution of Film Thickness | A | A | A |
| Temperature of Substrate | 65° C. or less | 65° C. or less | 65° C. or less |

EXAMPLE 2

The same procedure as in Example 1 was carried out except that a recording layer comprising a laminate of a Gd—Fe—Co film and a Tb—Fe—Co film in Example 1 was replaced with a recording film comprising a Tb—Fe—Co film formed by a magnetron sputtering process, thereby preparing a magnetooptical disc.

This magnetooptical disc had about the same characteristics as in Example 1.

EXAMPLE 3

The same procedure as in Example 1 was carried out except that as a material for first and second inorganic dielectric films, SiN$_x$ in Example 1 was replaced with SiC, to prepare an optical magnetic disc, and evaluation was made in the same manner as in Example 1.

Conditions for SiC film formation were as follows.

| RF frequency | 13.56 |
|---|---|
| Applied power | 3 kW |
| Magnetic field in an axis direction | 100 gausses |
| Gases | Reaction gas: C$_2$H$_2$ Material gas: SiH$_4$ |
| Gas flow rate | C$_2$H$_2$: 312 SCCM SiH$_4$: 96 SCCM |
| Pressure in a container | 0.7 Pa |

For the SiC film formed under the above-mentioned conditions, internal stress, refractive index, substrate temperature and the unevenness of film thickness were measured and evaluated in the same manner as in Example 1.

The results are shown in Table 2.

Comparative Example 3

The same procedure as in Example 3 was carried out except that film formation devices 13 and 15 for first and second SiC films used in Example 3 were replaced with electron beam cyclotron resonance (ECR) plasma CVD film formation devices shown in FIG. 8, to prepare a magnetooptical disc.

In this comparative example, as conditions for SiC film formation, the internal stress of the SiC film was set so as to be in a stress range (0 to −30 kg/mm$^2$) which an inorganic dielectric film for the magnetooptical disc could tolerate. In the concrete, the microwave having a frequency of 2.45 GHz was introduced into a plasma generating container 82 via a wave guide 81, and a magnetic field (875 gausses) which could meet conditions for the electron cyclotron resonance was then generated in the container by means of the coil 82 arranged outside the container. In this case, a microwave power of 500 W was used and SiH$_4$ and N$_2$ were fed at gas flow rates of 10 SCCM and 15 SCCM, respectively, and the gas pressure in the plasma generating container 82 and a process container 83 was adjusted to 1.5 Pa. In this connection, the plasma generating container 82, the process container 83 and the substrate were arranged as in Example 1. The internal stress of the thus prepared SiC film was −30 kg/mm$^2$ or less.

For the thus prepared magnetooptical disc, evaluation was made in the same manner as in Example 1. As a result, when the disc was: stored under high-temperature and high-humidity conditions, the large decline of a C/N ratio and the large rise of B.E.R. were observed, as shown in Table 2.

Comparative Example 4

The same procedure as in Comparative Example 1 was carried out except that a gas pressure which was one of film formation conditions in Comparative Example 3 was set to 0.4 Pa to increase a plasma density with the intention of obtaining a condensed SiC film having a high protection performance, thereby preparing an optical magnetic disc. This optical magnetic disc was evaluated in the same manner as in Example 1.

Furthermore, the stress of the SiC film formed under the conditions of this comparative example was also measured in the same manner as in Example 1. As a result, as shown in Table 2, the values of the C/N ratio and B.E.R. were high and so they were excellent even after the durability test. However, the internal stress of the SiC film was high, and so its tilt angle after the durability test was in excess of 5 mrad which was a standard value.

TABLE 2

|  | Example 3 | Comp. Example 3 | Comp. Example 4 |
|---|---|---|---|
| Evaluation of C/N Ratio (dB) | A | C | A |
| Evaluation of B.E.R. | A | C | A |
| Tilt Angle (mrad) | A | A | B |
| Stress (kg/mm$^2$) | −4.8 to −28.6 | −10.0 to −30.0 | −80.0 to −100.0 |
| Refractive Index | 2.21 to 2.37 | 2.10 to 2.41 | 2.21 to 2.36 |
| Film Formation Rate (nm/min) | 750 to 1,050 | 60 | 50 |
| Distribution of Film Thickness | A | A | A |
| Temperature of Substrate | 65° C. or less | 65° C. or less | 65° C. or less |

EXAMPLE 4

The same procedure as in Example 3 was carried out except that a recording layer comprising a laminate of a Gd—Fe—Co film and a Tb—Fe—Co film in Example 3 was replaced with a recording film comprising a Tb—Fe—Co film formed by a magnetron sputtering process, thereby preparing a magnetooptical disc.

The recording properties of this magnetooptical disc were inspected. As a result, a saturated C/N ratio was in the range of 48 dB to 50 dB. Thus, they are about the same as the characteristics of a magnetooptical disc in Example 3.

EXAMPLE 5

The same procedure as in Example 1 was carried out except that as a material for first and second inorganic dielectric films, $SiN_x$ in Example 1 was replaced with a-Si, to prepare a magnetooptical disc, and evaluation was then made.

Conditions for a-Si film formation were as follows.

| RF frequency | 13.56 |
|---|---|
| Applied power | 2.8 kW |
| Magnetic field in an axis direction | 100 gausses |
| Gases | Reaction gas: $C_2H_2$ |
| | Material gas: $SiH_4$ |
| Gas flow rate | $SiH_4$: 315 SCCM |
| Pressure in a container | 0.7 Pa |

In this case, a raw material gas was introduced through a gas introduction means 25.

For the a-Si film formed under the above-mentioned conditions, internal stress, refractive index, the unevenness of film thickness and substrate temperature immediately after the film formation were measured and evaluated in the same manner as in Example 1.

The results are shown in Table 3.

EXAMPLE 6

The same procedure as in Example 1 was carried out except that as a material for first and second inorganic dielectric films, $SiN_x$ in Example 1 was replaced with $SiO_2$, to prepare a magnetooptical disc, and evaluation was then made.

Conditions for $SiO_2$ film formation were as follows.

| RF frequency | 13.56 MHz |
|---|---|
| Applied power | 2.8 kW |
| Magnetic field in an axis direction | 100 gausses |
| Gases | Reaction gas: $O_2$ |
| | Material gas: $SiH_4$ |
| Gas flow rate | $O_2$: 312 SCCM |
| | $SiH_4$: 96 SCCM |
| Pressure in a container | 0.7 Pa |

For the $SiO_2$ film formed under the above-mentioned conditions, internal stress, refractive index, the unevenness of film thickness and substrate temperature immediately after the film formation were measured and evaluated in the same manner as in Example 1.

The results are shown in Table 3.

EXAMPLE 7

The same procedure as in Example 1 was carried out except that in place of a magnetooptical recording film in Example 1, a recording film comprising an Sb—Te alloy was formed by a magnetron sputtering process, thereby preparing a phase change type optical disc.

The characteristics of this optical disc were evaluated in the same manner as in Example 1. The results are shown in Table 3.

In order to measure a C/N ratio and B.E.R. of the optical disc in this example, an optical disc evaluation device (trade name OMS-2000; made by Nakamichi Co., Ltd.) was employed.

Reference Example 1

The same procedure as in Example 1 was carried out except that film formation devices 13 and 15 for first and second $SiN_x$ films used in Example 1 were replaced with RF magnetron sputtering film formation devices, to prepare an optical magnetic disc.

Figure 9:
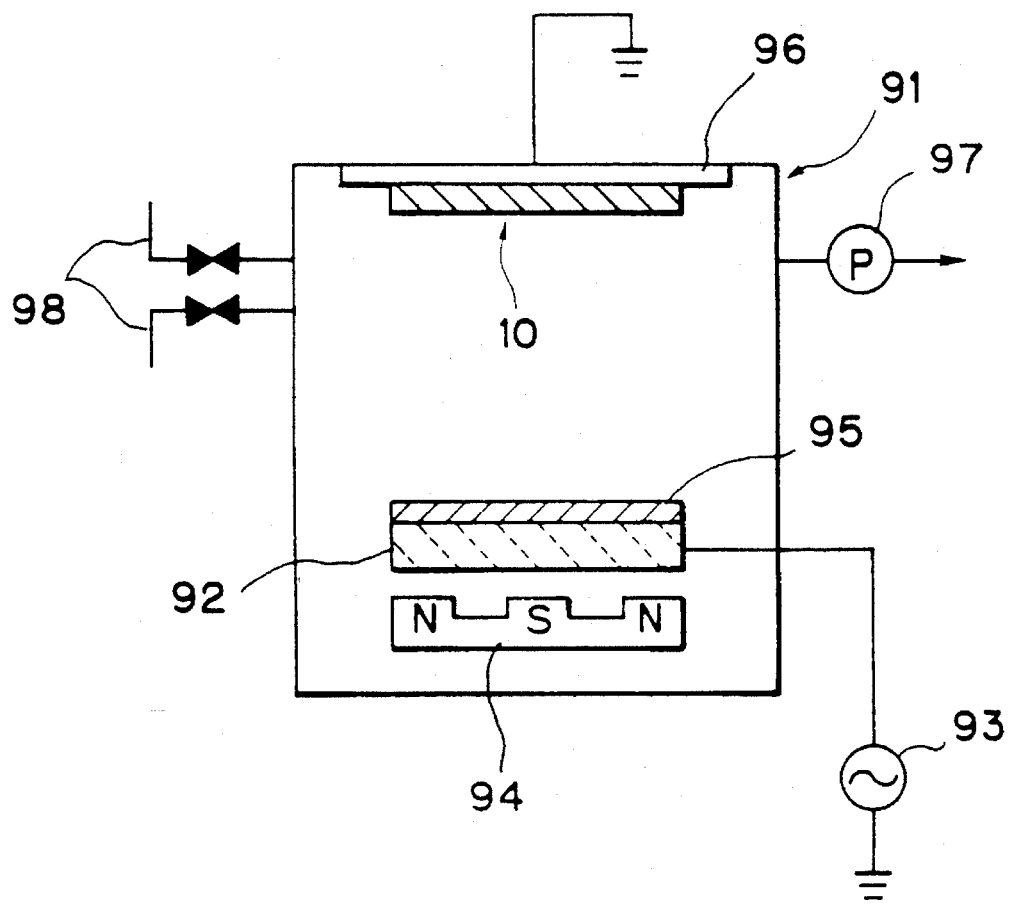
FIG. 9 is a schematic sectional view of an RF magnetron sputtering film formation device.

As shown in FIG. 9, the magnetron sputtering film formation device comprises a film forming chamber 91, a conductive backing plate 92 which functions as a cathode electrode, an RF power source 93 for imparting a predetermined sputtering power to a target 95 connected to and mounted on the backing plate, a permanent magnet 94, a substrate holder 96 for supporting a substrate 10, a vacuum pump 97, and a gas introduction means 98.

In this Reference Example 1, the film forming chamber was first evacuated to $1\times10^{-5}$ Pa, and an argon gas and a nitrogen gas were then introduced into the chamber so that the pressure of a mixed gas of the argon gas and the nitrogen gas might be 0.2 Pa (argon:nitrogen=20:10 SCCM). Afterward, the $SiN_x$ film was formed at an RF power of 7 W/cm² by reactive sputtering. The thus obtained optical magnetic disc was evaluated in the same manner as in Example 1. In consequence, as shown in Table 3, a C/N ratio, B.E.R. and a tilt angle were excellent even after the durability test. In addition, stress and refractive index and thickness distribution of the $SiN_x$ film and substrate temperature were also within an acceptable range. However, the deposition rate of the $SiN_x$ film was about 60 to 100 Å, which was about 1/100 of a film deposition rate in the case of a plasma CVD method.

Reference Example 2

For the purpose of improving a film formation rate in Reference Example 1, an RF power of 10 W/cm² was used to form a film. As a result, an abnormal discharge often occurred, and so it was difficult to form the high-quality dielectric film free from defects such as pinholes.

Furthermore, the temperature of a substrate rose substantially in proportion to a deposition rate, and at a deposition rate of 10 nm/min or more, the substrate warped more than 200 μm or more. For this reason, mechanical properties required for an optical magnetic disc could not be satisfied.

TABLE 3

| | Example 5 | Example 6 | Example 7 | Ref. Example 1 |
|---|---|---|---|---|
| Evaluation of C/N Ratio (dB) | A | A | A | A |
| Evaluation of B.E.R. | A | A | A | A |
| Tilt Angle (mrad) | A | A | A | A |
| Stress (kg/mm²) | −5.0 to −25.0 | −5.0 to −25.0 | −5.0 to −25.0 | −5.0 to −25.0 |
| Refractive Index | 2.9 to 3.0 | 1.9 to 2.0 | 2.17 to 2.25 | 2.17 to 2.25 |
| Film Formation Rate (nm/min) | 650 to 850 | 750 to 1,050 | 650 to 850 | 6 to 10 |
| Distribution of Film Thickness | A | A | A | A |
| Temperature of Substrate | 65° C. or less | 65° C. or less | 65° C. or less | 65° C. or less |

EXAMPLE 8

The same procedure as in Example 1 was carried out except that the diameter of a window at the connected portion of a plasma generating container 21 and a process container 24 in Example 1 was set to 70 mm, to prepare a magnetooptical disc, and evaluation was then made.

For an $SiN_x$ film formed by the process of this example, stress, refractive index, film formation rate, film thickness unevenness and substrate temperature were measured and evaluated in the same manner as in Example 1. The results are shown in Table 4.

EXAMPLE 9

The same procedure as in Example 1 was carried out except that a space between the loops of an antenna 22 in Example 1 was set to 80 mm, to prepare a magnetooptical disc, and evaluation was then made.

For an $SiN_x$ film formed by the process of this example, stress, refractive index, film formation rate, film thickness unevenness and substrate temperature immediately after the film formation were measured and evaluated in the same manner as in Example 1. The results are shown in Table 4.

EXAMPLE 10

The same procedure as in Example 1 was carried out except that a substrate 10 in Example 1 was replaced with a substrate for a 3.5 inch optical disc having an outer diameter of 86 mm, an inner diameter of 15 and a thickness of 1.2 mm and made from a polycarbonate resin (trade name Yupiron H4000; made by Mitsubishi Gas Chemical Co., Ltd.), to prepare a magnetooptical disc, and evaluation was then made.

For an $SiN_x$ film formed by the process of this example, stress, refractive index, film formation rate, film thickness unevenness and substrate temperature were measured and evaluated in the same manner as in Example 1. The results are shown in Table 4.

EXAMPLE 11

The same procedure as in Example 3 was carried out except that a substrate 10 in Example 3 was replaced with a substrate for a 3.5 inch optical disc having an outer diameter of 86 mm, an inner diameter of 15 and a thickness of 1.2 mm and made from a polycarbonate resin (trade name Yupiron H4000; made by Mitsubishi Gas Chemical Co., Ltd.), to prepare a magnetooptical disc, and evaluation was then made.

For an $SiN_x$ film formed by the process of this example, stress, refractive index, film formation rate, film thickness unevenness and substrate temperature were measured and evaluated in the same manner as in Example 3. The results are shown in Table 4.

TABLE 4

|  | Example 8 | Example 9 | Example 10 | Example 11 |
|---|---|---|---|---|
| Evaluation of C/N Ratio (dB) | A | B | A | A |
| Evaluation of B.E.R. | A | B | A | A |
| Tilt Angle (mrad) | A | A | A | A |
| Stress (kg/mm$^2$) | −5.0 to −25.0 | −3.0 to −18.0 | −5.1 to −25.3 | −5.0 to −29.0 |
| Refractive Index | 2.17 to 2.25 | 2.13 to 2.20 | 2.17 to 2.30 | 2.21 to 2.37 |
| Film Formation Rate (nm/min) | 700 | 500 | 700 | 700 |
| Distribution of | B | A | AA | AA |

TABLE 4-continued

|  | Example 8 | Example 9 | Example 10 | Example 11 |
|---|---|---|---|---|
| Film Thickness Temperature of Substrate | 65° C. or less | 65° C. or less | 65° C. or less | 65° C. or less |

What is claimed is:

1. A process for manufacturing an optical recording medium comprising a substrate and a laminate of a recording film and an inorganic dielectric film thereon, wherein said process comprises forming the inorganic dielectric film by using a helicon wave plasma CVD method wherein said helicon wave plasma CVD method comprises:

a step of preparing a plasma generating container extending along an axis and a process container arranged adjacent to the plasma generating container along the axis;

a step of arranging the substrate in the process container so that the surface of the substrate crosses at right angles to the axis;

a step of introducing at least one of a reaction gas and a raw material gas into the plasma generating container; and a step of generating a high-frequency electric field and a magnetic field along the axis in the plasma generating container to convert the gas in the plasma generating container into a helicon wave plasma.

2. The process for manufacturing an optical recording medium according to claim 1, wherein said high-frequency electric field is generated by an antenna provided around the plasma generating container.

3. The process for manufacturing an optical recording medium according to claim 1, wherein the frequency of said high-frequency electric field is in the range of 10 to 30 MHz.

4. The process for manufacturing an optical recording medium according to claim 1, wherein the strength (G) of said magnetic field meets the requirement of $0<G\leq500$ gausses in the central portion of the plasma generating container.

5. The process for manufacturing an optical recording medium according to claim 1, wherein the strength (G) of said magnetic field meets the requirement of $0<G\leq200$ gausses in the central portion of the plasma generating container.

6. The process for manufacturing an optical recording medium according to claim 1, wherein the strength (G) of said magnetic field meets the requirement of $10<G\leq100$ gausses in the central portion of the plasma generating container.

7. The process for manufacturing an optical recording medium according to claim 1, wherein said magnetic field is generated by a coil provided around the plasma generating container.

8. The process for manufacturing an optical recording medium according to claim 2, wherein said antenna is constituted so as to draw two mutually separated loops surrounding the plasma generating container.

9. The process for manufacturing an optical recording medium according to claim 8, wherein a space between the loops of said antenna is in the range of 100 to 500 mm.

10. The process for manufacturing an optical recording medium according to claim 9, wherein a space between the loops of said antenna is in the range of 100 to 250 mm.

11. The process for manufacturing an optical recording medium according to claim 8, wherein a high-frequency current is caused to flow through the loops in a mutually reverse direction.

12. The process for manufacturing an optical recording medium according to claim 1, wherein said inorganic dielectric film is an Si-based semiconductor film.

13. The process for manufacturing an optical recording medium according to claim 1, wherein said inorganic dielectric film containing an Si-based semiconductor is formed by the use of at least one raw material gas selected from the group consisting of inorganic silanes, organic silanes and halosilanes.

14. The process for manufacturing an optical recording medium according to claim 1, wherein said inorganic dielectric film is an Si-based compound film.

15. The process for manufacturing an optical recording medium according to claim 1, wherein said inorganic dielectric film containing a Si-based semiconductor is formed by the use of at least one raw material gas selected from the group consisting of inorganic silanes, organic silanes and halosilanes, and a reaction gas.

16. The process for manufacturing an optical recording medium according to claim 1, wherein said inorganic dielectric film is a metallic compound film.

17. The process for manufacturing an optical recording medium according to claim 1, wherein said inorganic dielectric film containing a metallic compound is formed by the use of at least one raw material gas selected from the group consisting of organic metals and halogenated metals, and a reaction gas.

18. The process for manufacturing an optical recording medium according to claim 1, wherein said reaction gas is introduced into the plasma generating container and the raw material gas is introduced into the process container.

19. The process for manufacturing an optical recording medium according to claim 1, wherein the formation of a film is carried out by generating a magnetic field in the vicinity of the inside wall of the process container.

20. The process for manufacturing an optical recording medium according to claim 19, wherein said magnetic field is generated by permanent magnets mounted on the outside wall of the process container.

21. The process for manufacturing an optical recording medium according to claim 20, wherein said magnets are arranged so that the same pole extends in the direction of the axis of the process container and so that different poles is alternated along the periphery of the process container.

22. The process for manufacturing an optical recording medium according to claim 1, wherein said recording film contains at least either of a rare earth element and a transition metal.

23. The process for manufacturing an optical recording medium according to claim 1, wherein said recording film is an amorphous magnetic recording film containing a rare earth element and a transition metal.

24. The process for manufacturing an optical recording medium according to claim 1, wherein said recording film contains a chalcogenide element.

* * * * *

UNITED STATES PATENT AND TRADEMARK OFFICE
CERTIFICATE OF CORRECTION

PATENT NO. : 5,525,379

DATED : June 11, 1996

INVENTORS : KUNIO TAKADA ET AL.

It is certified that error appears in the above-identified patent and that said Letters Patent is hereby corrected as shown below:

ON TITLE PAGE

Item [56] References Cited, under FOREIGN PATENT DOCUMENTS

"4-30343  3/1992 Japan" should read --4-30343  2/1992 Japan--.

COLUMN 1

Line 42,  "medium" should read --media--.

COLUMN 2

Line 22,  "Accordingly" should read --Accordingly,--;
Line 62,  "Further" should read --Further,--.

COLUMN 6

Line 4,  "$\pm$ + kg/mm$^2$" should read --$\pm$ 30kg/mm$^2$--.

UNITED STATES PATENT AND TRADEMARK OFFICE
CERTIFICATE OF CORRECTION

PATENT NO. : 5,525,379

DATED : June 11, 1996

INVENTORS : KUNIO TAKADA ET AL.

It is certified that error appears in the above-identified patent and that said Letters Patent is hereby corrected as shown below:

COLUMN 7

Line 58, "Also" should read --Also,--;
Line 59, "film" should read --films--.

COLUMN 11

Line 29, "$\lambda$a" should read --$\lambda$: a--.

COLUMN 14

Line 16, "was:" should read --was--.

UNITED STATES PATENT AND TRADEMARK OFFICE
CERTIFICATE OF CORRECTION

PATENT NO. : 5,525,379

DATED : June 11, 1996

INVENTORS : KUNIO TAKADA ET AL.

It is certified that error appears in the above-identified patent and that said Letters Patent is hereby corrected as shown below:

<u>COLUMN 19</u>

```
Line 5,    "an" should read --a--.
Line 8,    "an" should read --a--.
Line 21,   "an" should read --a--.
```

Signed and Sealed this

Fourteenth Day of January, 1997

Attest:

BRUCE LEHMAN

*Attesting Officer*     Commissioner of Patents and Trademarks